(12) United States Patent
Lin

(10) Patent No.: US 7,031,148 B1
(45) Date of Patent: Apr. 18, 2006

(54) NOTEBOOK COMPUTER PROTECTOR

(76) Inventor: Chia-Hao Lin, No. 27, Yenping N. Rd., Sec. 1, Tatung Dist., Taipei City (TW)

( * ) Notice: Subject to any disclaimer, the term of this patent is extended or adjusted under 35 U.S.C. 154(b) by 0 days.

(21) Appl. No.: 11/196,309

(22) Filed: Aug. 4, 2005

(51) Int. Cl.
*H05K 5/00* (2006.01)

(52) U.S. Cl. ...................... 361/683; 361/680; 361/681; 206/320; 206/701; 150/154

(58) Field of Classification Search ................ None
See application file for complete search history.

(56) References Cited

U.S. PATENT DOCUMENTS

| | | | |
|---|---|---|---|
| 5,931,297 A * | 8/1999 | Weill et al. ............... 206/320 |
| 6,267,236 B1 * | 7/2001 | Seok ........................ 206/320 |
| 6,775,128 B1 * | 8/2004 | Leitao ...................... 361/681 |
| 6,887,002 B1 * | 5/2005 | Chen ........................ 400/490 |
| 2005/0139498 A1 * | 6/2005 | Goros ....................... 206/320 |

\* cited by examiner

*Primary Examiner*—Lynn Feild
*Assistant Examiner*—Anthony Q. Edwards
(74) *Attorney, Agent, or Firm*—Rosenberg, Klein & Lee

(57) ABSTRACT

A notebook computer includes a transparent main member case and a transparent display module case respectively formed of a front cover shell and a back cover shell for accommodating and protecting the main member and display module of a notebook computer. The front cover shell has angled peripheral flanges extending around three of the four sides thereof for covering the periphery of the main member or display module of the notebook computer to hold the main member or display module inside the respective case in perfect fitness.

2 Claims, 4 Drawing Sheets

NOTEBOOK COMPUTER PROTECTOR

BACKGROUND OF THE INVENTION

1. Field of the Invention

The present invention relates to protective covers and more particularly, to a notebook computer protector for protecting the main member and display module of a notebook computer.

2. Description of the Related Art

Regular notebook computers do not have means to protect the surface thereof. A notebook computer use may use a bag for carrying the notebook computer. However, the bag may rub against the surface of the notebook computer when carrying, thereby causing damage to the surface of the notebook computer. Further, when the notebook computer is in use after removal of the bag, splashing water drops may wet the notebook computer accidentally. When water drops entered a notebook computer, the internal circuit of the notebook computer may be damaged or short-circuited.

SUMMARY OF THE INVENTION

The present invention has been accomplished under the circumstances in view. It is therefore the main object of the present invention to provide a notebook computer protector, which well protects the surface of the main member and display module of the notebook computer. To achieve this and other objects of the present invention, the notebook computer protector is comprised of a transparent main member case and a transparent display module case respectively formed of a front cover shell and a back cover shell for accommodating and protecting the main member and display module of a notebook computer. The front cover shell is bonded to the respective back cover shell by a heat sealing apparatus. The front cover shell has angled peripheral flanges extending around three of the four sides thereof for covering the periphery of the main member or display module of the notebook computer to hold the main member or display module inside the respective case in perfect fitness.

BRIEF DESCRIPTION OF THE DRAWINGS

FIGS. 3A—A is a sectional view taken in an enlarged scale along line A—A of FIG. 3.

FIGS. 3B—B is a sectional view taken in an enlarged scale along line B—B of FIG. 3.

DETAILED DESCRIPTION OF THE PREFERRED EMBODIMENT

Figure 1:
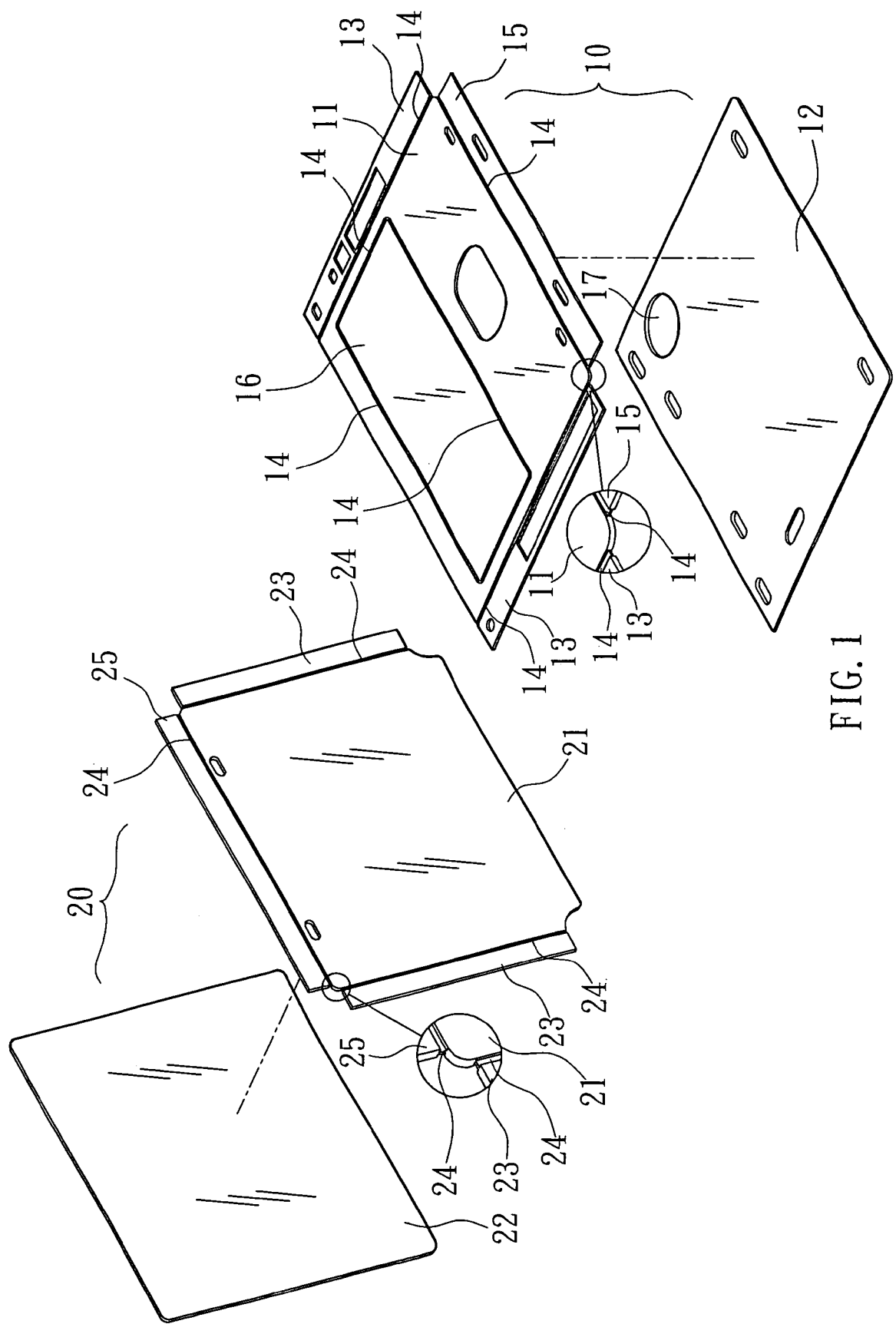
FIG. 1 is an exploded view of a notebook computer protector according to the present invention.
Figure 2:
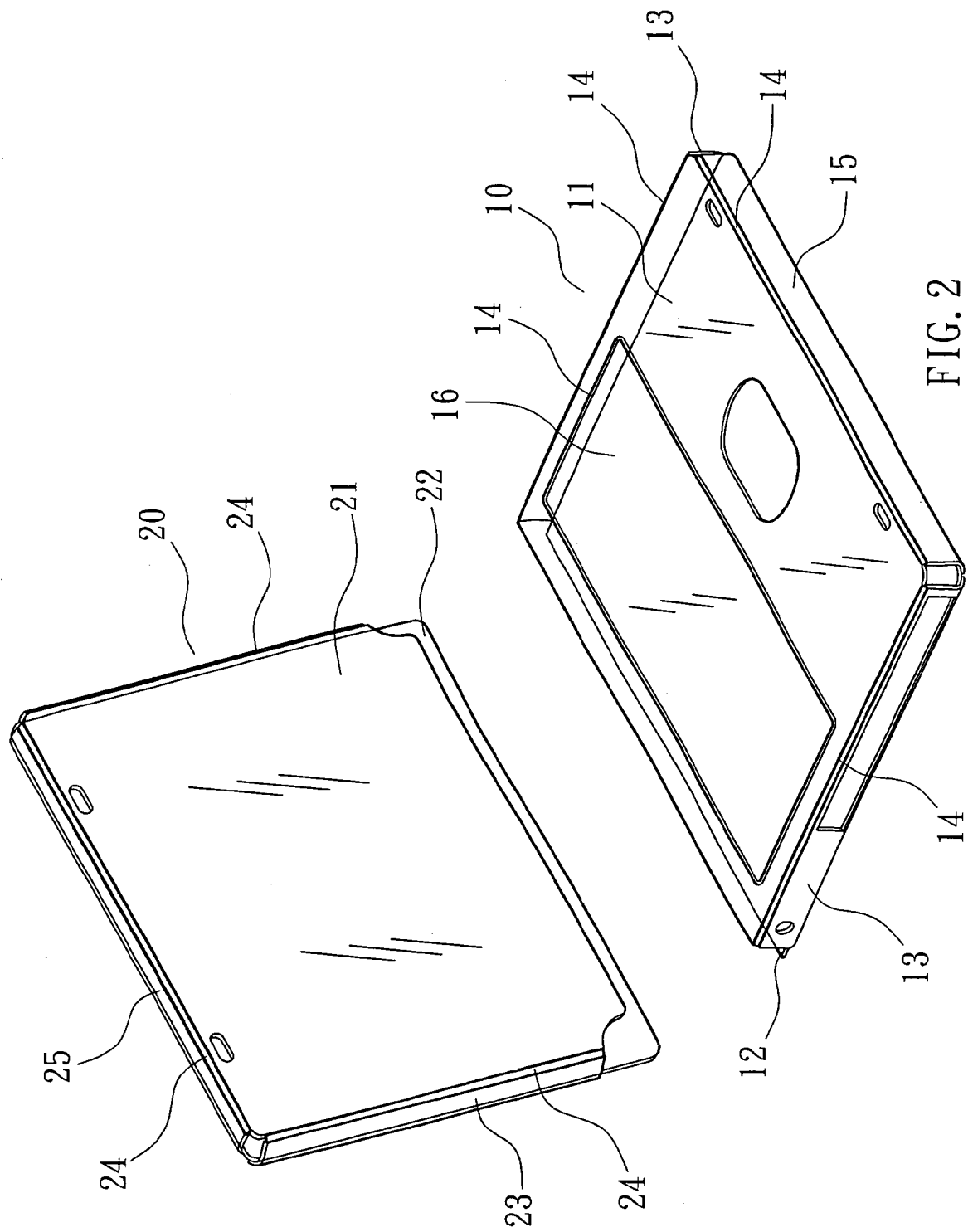
FIG. 2 is an assembly view of the main member case and display module case of the notebook computer protector according to the present invention.
Figure 3:
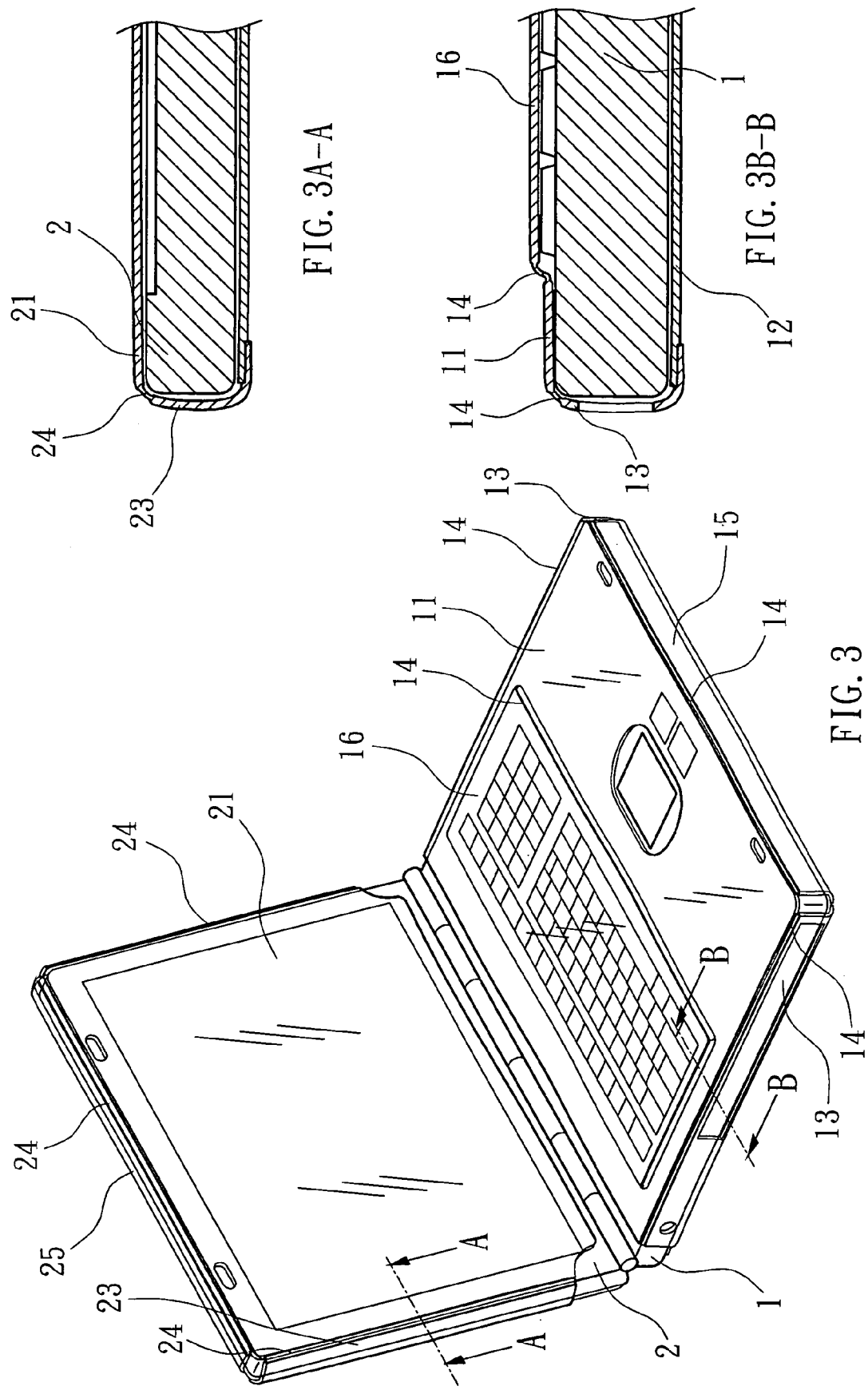
FIG. 3 is an applied view of the present invention showing the notebook computer protector fastened to a notebook computer.

Referring to FIGS. 1~3, a notebook computer protector in accordance with the present invention comprises a transparent rectangular main member case 10 and a transparent rectangular display module case 20 for accommodating and protecting the main unit 1 and display module 2 of a notebook computer. The main member case 10 is comprised of a transparent, flat, rectangular front cover shell 11 and a transparent, flat, rectangular back cover shell 12. The display module case 20 is comprised of a transparent, flat, rectangular front cover shell 21 and a transparent, flat, rectangular back cover shell 22. The front cover shell 11 or 21 and the back cover shell 12 or 22 are bonded together.

The front cover shell 11 of the main member case 10 has two side flanges 13 and a front flange 15 respectively extended along three of the four peripheral sides of the body thereof and bonded to the back cover shell 12, forming with the back cover shell 12 the main member case 10 having three closed sides and one open side. Through the open side, the main member 1 of the notebook computer is inserted into the inside of the main member case 10. The front cover shell 11 has a keyboard area 16 corresponding to the keyboard of the main member 1 of the notebook computer 1. Further, thin connecting portions 14 are provided at the connection area between the body of the front cover shell 11 and each of the flanges 13 and 15 the connection area between the body and each of the four sides of the keyboard area 16, keeping the flanges 13 and 15, the body of the front cover shell 11 and the keyboard area 16 at different elevations. Further, the back cover shell 12 has an air vent 17 for ventilation.

The front cover shell 21 of the display module case 20 has two side flanges 23 and a front flange 25 respectively extended along three of the four peripheral sides of the body thereof, and thin connecting portions 24 respectively connected between the body of the front cover shell 21 and each of the flanges 23 and 25, keeping the flanges 23 and 25 and the body of the front cover shell 21 at different elevations. After bonding of the flanges 23 and 35 of the front cover shell 21 to the back cover shell 22, the desired display module case 20 is thus obtained that has three closed sides and one open side. Through the open side, the display module 2 of the notebook computer is inserted into the inside of the display module case 20.

Further, the aforesaid connecting portions 14 and 24 are formed by means of the use of a heat press, i.e., the cover shells 11, 12, 21 and 22 are respectively made of a respective transparent plastic plate in integrity. Further, the front cover shells 11 or 21 is bonded to the back cover shell 12 or 22 by a heat sealing apparatus.

Referring to FIGS. 3A—A and 3B—B and FIG. 3 again, the flanges 13 or 23 have a substantially angled cross section for covering over the periphery of the main member 1 or display module 2. Further, because the keyboard area 16 is a raised area above the elevation of the body of the front cover shell 11 of the main member case 10, the main member case 10 fits the outer appearance of the main member 1 of the notebook computer well without affecting the sense of beauty.

Figure 4:
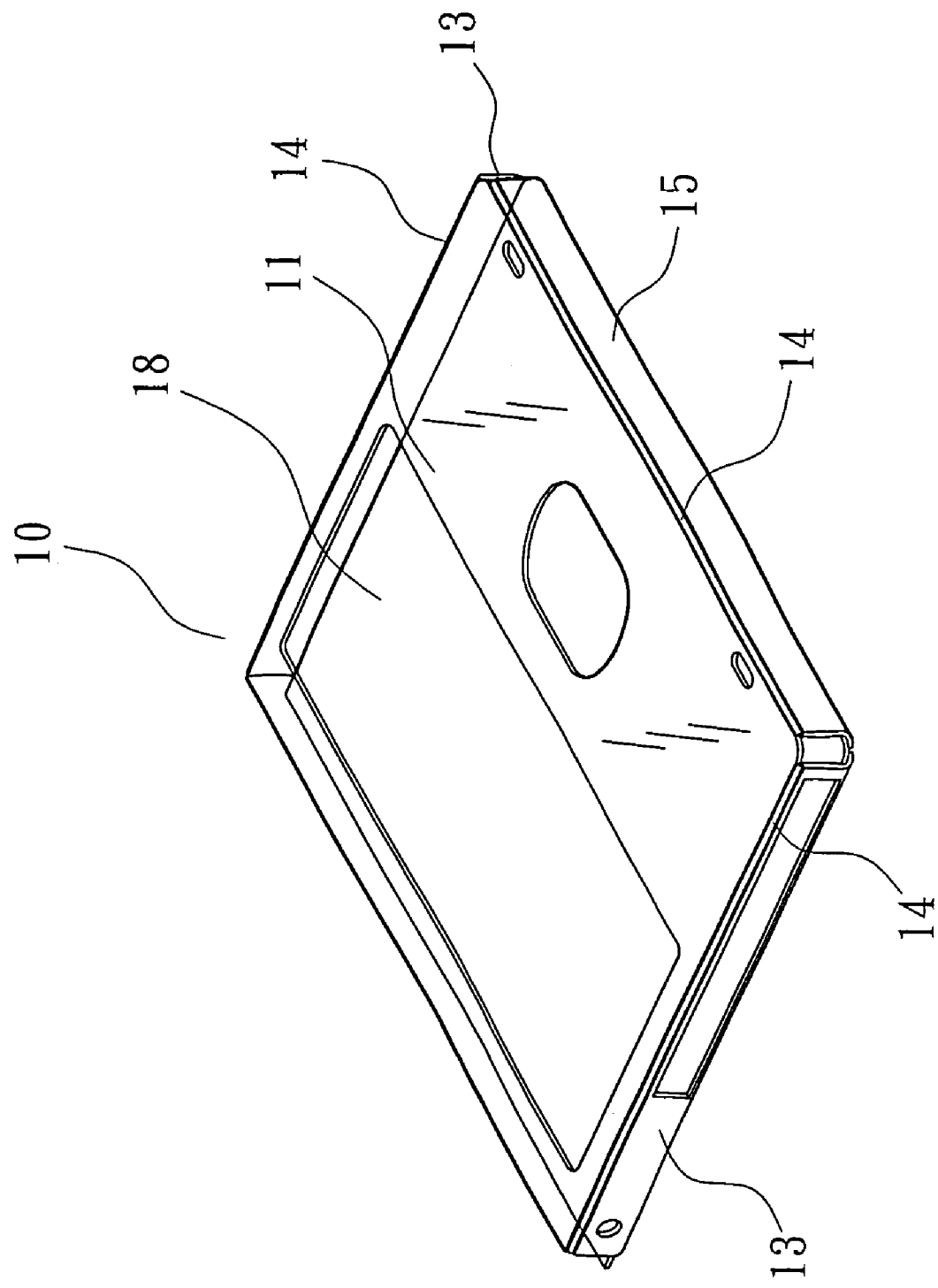
FIG. 4 is a perspective view of an alternate form of the notebook computer protector according to the present invention.

FIG. 4 shows an alternate form of the present invention. According to this embodiment, the front cover shell 11 of the main member case 10 has an opening 18 corresponding to the keyboard of the main member 1 of the notebook computer. This embodiment allows the user to operate the notebook computer without removal of the notebook computer protector.

A prototype of notebook computer protector has been constructed with the features of FIGS. 1~4. The notebook computer protector functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A notebook computer protector comprising a transparent rectangular main member case and a transparent rectangular display module case for accommodating and protecting the main unit and display module of a notebook computer, said main member case and said display module case each being comprised of a transparent, flat, rectangular front cover shell and a transparent, flat, rectangular back cover shell bonded to said transparent, flat, rectangular front cover shell, wherein the front cover shell of said main member case has three peripheral flanges respectively extended along three of four peripheral sides of a flat rectangular body thereof and bonded to the back cover shell of said main member case, the peripheral flanges of said main member case having an angled cross section, a rectangular keyboard area defined in the body of the front cover shell of said main member case, and a plurality of thin connecting portions respectively connected between the body of the front cover shell of said main member case and the flanges of the front cover shell of said main member case and between the body of the front cover shell of said main member case and the four peripheral sides of said keyboard area to hold the respective peripheral flanges of the front cover shell of said main member case and said keyboard area and the body of the front cover shell of said main member case at different elevations; the back cover shell of said main member case has at least one air vent for ventilation; wherein the front cover shell of said display module case has three peripheral flanges respectively extended along three of four peripheral sides of a flat rectangular body thereof and bonded to the back cover shell of said display module case, the peripheral flanges of said display module case having an angled cross section, and a plurality of thin connecting portions respectively connected between the body of the front cover shell of said display module case and the peripheral flange of the front cover shell of said display module case to hold the respective peripheral flanges and the body of the front cover shell of said display module case at two different elevations.

2. The notebook computer protector as claimed in claim 1, wherein the keyboard area of the front cover shell of said main member case is an opening corresponding to the keyboard of the main member of the notebook computer to be protected.

* * * * *